United States Patent
Gupta et al.

(10) Patent No.: US 12,471,234 B2
(45) Date of Patent: Nov. 11, 2025

(54) ADJUSTABLE CABLE MANAGEMENT BRACKET FOR MODULAR ELECTRONIC SYSTEM

(71) Applicant: Cisco Technology, Inc., San Jose, CA (US)

(72) Inventors: Rohit Dev Gupta, Bangalore (IN); Shailesh R. Nayak, Bangalore (IN); Viktor Brauer, Nuremberg (DE); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/616,817

(22) Filed: Mar. 26, 2024

(65) Prior Publication Data

US 2024/0237254 A1 Jul. 11, 2024

Related U.S. Application Data

(63) Continuation of application No. 17/171,634, filed on Feb. 9, 2021, now Pat. No. 12,010,809, which is a continuation of application No. 16/001,835, filed on Jun. 6, 2018, now Pat. No. 10,952,345.

(51) Int. Cl.
*H05K 7/14* (2006.01)
*F16L 3/01* (2006.01)

(52) U.S. Cl.
CPC .............. *H05K 7/1447* (2013.01); *F16L 3/01* (2013.01)

(58) Field of Classification Search
None
See application file for complete search history.

(56) References Cited

U.S. PATENT DOCUMENTS

| | | |
|---|---|---|
| 6,294,735 B1 | 9/2001 | Sobel et al. |
| 6,590,785 B1 | 7/2003 | Lima et al. |
| 6,818,834 B1 | 11/2004 | Lin |
| 7,097,047 B2 | 8/2006 | Lee et al. |
| 7,510,421 B2 | 3/2009 | Fransen et al. |
| 7,607,938 B2 | 10/2009 | Clark et al. |
| 8,024,839 B2 | 9/2011 | Lewis, II |
| 8,040,692 B2 | 10/2011 | Hetzer et al. |
| 8,068,351 B2 | 11/2011 | Figueroa et al. |
| 8,093,499 B2 | 1/2012 | Hoffer et al. |
| 8,262,035 B2 | 9/2012 | Bleus et al. |
| 8,520,996 B2 | 8/2013 | Cowen et al. |
| 8,526,774 B2 | 9/2013 | Krampotich et al. |
| 8,668,096 B2 | 3/2014 | Von De Linde |
| 8,872,030 B2 * | 10/2014 | McNeal .................. H04Q 1/02 248/65 |
| 8,879,882 B2 | 11/2014 | Conner et al. |
| 8,931,742 B2 | 1/2015 | Gong et al. |
| 9,071,890 B2 | 6/2015 | Ruiz |
| 9,281,676 B2 | 3/2016 | Chen et al. |
| 9,348,104 B2 | 5/2016 | Thijs et al. |
| 9,429,251 B1 | 8/2016 | Lin |
| 9,699,936 B1 | 7/2017 | Vargas |

(Continued)

*Primary Examiner* — Xanthia C Relford

(57) ABSTRACT

In one embodiment, an apparatus includes a module receivable in a modular electronic system, arms extending from a front panel of the module, and a cable support bracket connected to the arms. The cable support bracket is slidably connected to the arms to change a distance between the cable support bracket and the front panel of the module.

20 Claims, 15 Drawing Sheets

(56) References Cited

U.S. PATENT DOCUMENTS

| | | | |
|---|---|---|---|
| 9,703,061 B1 | 7/2017 | Fernandez et al. | |
| 9,730,356 B2 | 8/2017 | Franz et al. | |
| 9,810,869 B2 | 11/2017 | Campbell et al. | |
| 9,848,702 B2 | 12/2017 | Chen et al. | |
| 9,877,407 B1 * | 1/2018 | Sim | H04Q 1/06 |
| 9,888,603 B1 * | 2/2018 | Vargas | H05K 7/14 |
| 10,076,054 B2 | 9/2018 | Goergen et al. | |
| 10,167,981 B2 | 1/2019 | Cheng et al. | |
| 10,340,674 B1 * | 7/2019 | Chompff | F16L 3/137 |
| 10,420,248 B1 * | 9/2019 | Yu | H05K 7/1491 |
| 10,694,265 B2 | 6/2020 | Sticker et al. | |
| 10,707,665 B2 | 7/2020 | Varale et al. | |
| 10,827,642 B2 | 11/2020 | Chen et al. | |
| 2004/0035983 A1 * | 2/2004 | Simonson | H02G 15/117 |
| | | | 248/49 |
| 2004/0120134 A1 | 6/2004 | Nguyen et al. | |
| 2004/0216911 A1 | 11/2004 | Franz et al. | |
| 2007/0190815 A1 | 8/2007 | Sampson et al. | |
| 2008/0093120 A1 | 4/2008 | Nakayama | |
| 2009/0224110 A1 | 9/2009 | Donowho et al. | |
| 2009/0245746 A1 | 10/2009 | Krampotich et al. | |
| 2011/0253647 A1 | 10/2011 | Yu et al. | |
| 2014/0030907 A1 | 1/2014 | Tseng et al. | |
| 2015/0068992 A1 | 3/2015 | Chen et al. | |
| 2015/0181743 A1 | 6/2015 | Skirmont et al. | |
| 2016/0175504 A1 | 6/2016 | Iske et al. | |
| 2017/0290192 A1 | 10/2017 | Goergen et al. | |

* cited by examiner

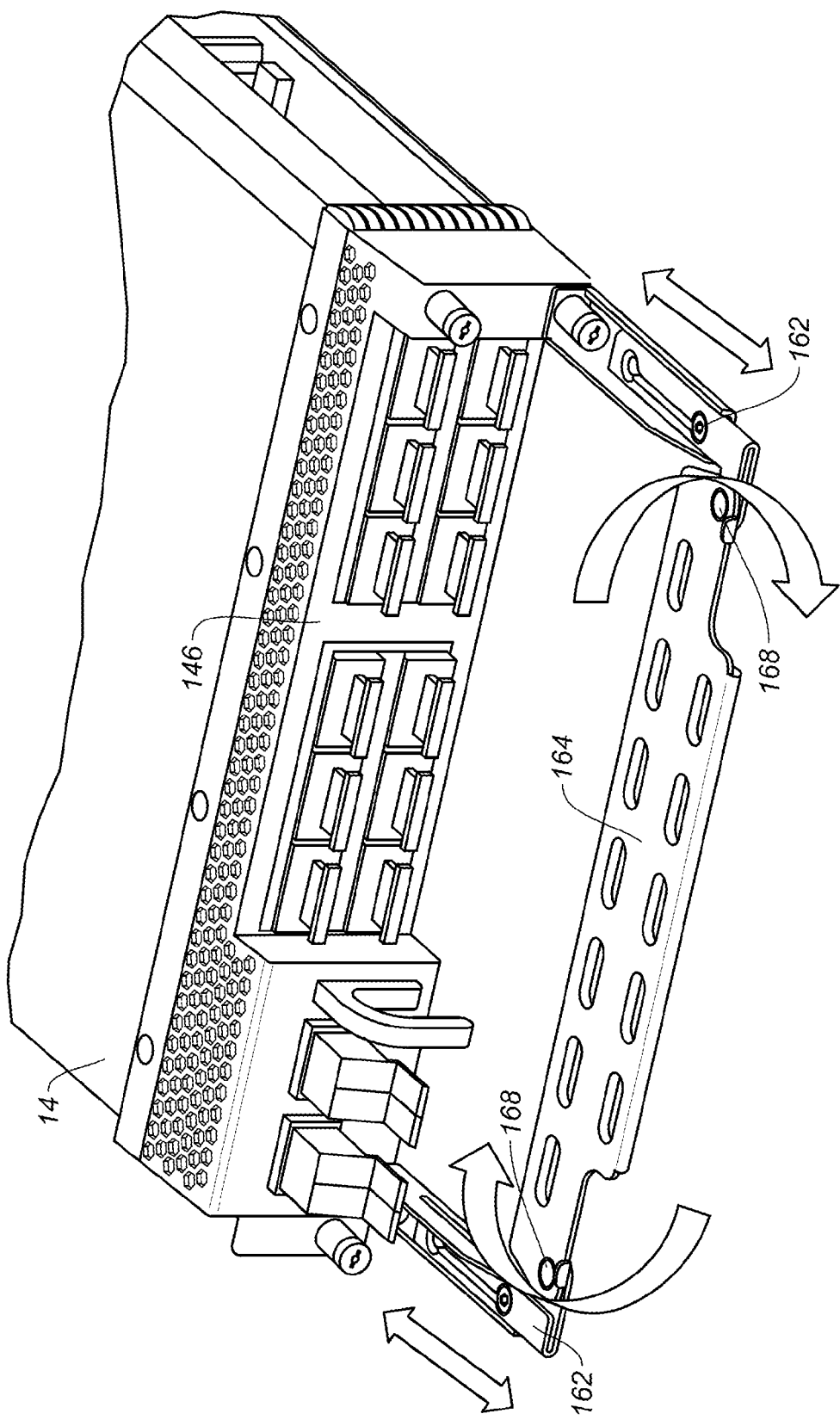

ADJUSTABLE CABLE MANAGEMENT BRACKET FOR MODULAR ELECTRONIC SYSTEM

STATEMENT OF RELATED APPLICATION

The present application is a continuation of U.S. patent application Ser. No. 17/171,634, entitled ADJUSTABLE CABLE MANAGEMENT BRACKET FOR MODULAR ELECTRONIC SYSTEM, filed Feb. 9, 2021, and issued as U.S. Pat. No. 12,010,809, which is a continuation of U.S. patent application Ser. No. 16/001,835, entitled ADJUSTABLE CABLE MANAGEMENT BRACKET FOR MODULAR ELECTRONIC SYSTEM, filed Jun. 6, 2018, and issued as U.S. Pat. No. 10,952,345, each of which is hereby incorporated by reference in its entirety for all purposes.

TECHNICAL FIELD

The present disclosure relates generally to network communications devices, and more particularly, to cable management for modular electronic systems.

BACKGROUND

Modular electronic systems are designed to provide flexibility to configure systems as per user needs. These systems typically have multiple slots to accommodate a variety of modules. With increased packaging density of networking interconnects to provide higher bandwidth, effective cable management is becoming an increasingly important issue.

BRIEF DESCRIPTION OF THE DRAWINGS

FIG. 14 illustrates another embodiment of the adjustable line card cable bracket.

Corresponding reference characters indicate corresponding parts throughout the several views of the drawings.

DESCRIPTION OF EXAMPLE EMBODIMENTS

Overview

Figure 1:
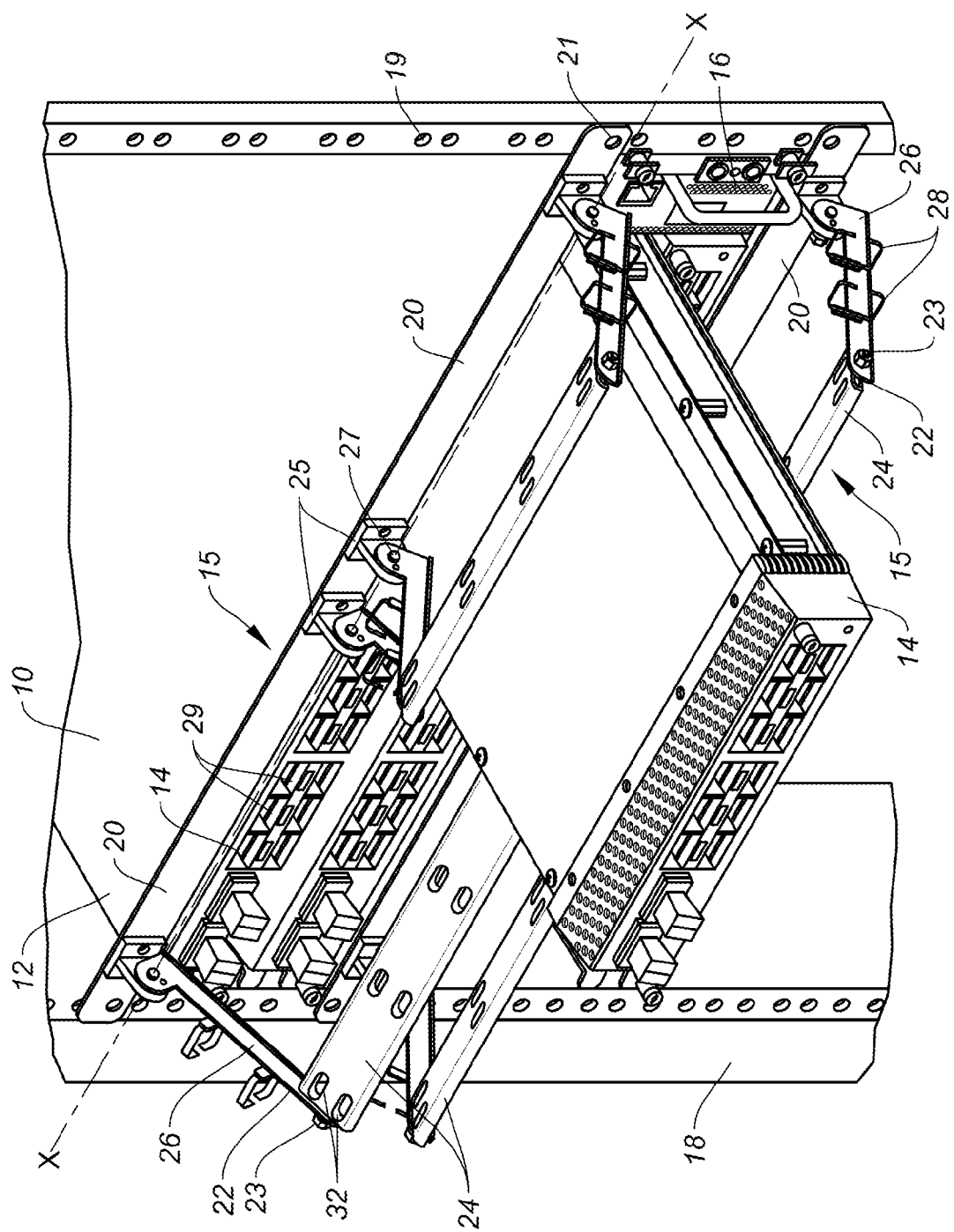
FIG. 1 is a perspective of a cable support system installed on a modular electronic system, in accordance with one embodiment.

In one embodiment, a cable management bracket for managing cables connected to a modular electronic system mounted on a rack comprises a fixed portion and a rotatable portion extending from the fixed portion and comprising a support member for supporting the cables, the rotatable portion rotatable with the cables to allow for removal and insertion of a module of the modular electronic system.

In another embodiment, an apparatus generally comprises a module receivable in a modular electronic system and a cable management bracket for managing cables connected to the modular electronic system, the cable management bracket comprising a fixed portion connected to the module and a rotatable portion extending from one end of the fixed portion and movable with the cables when installed in the modular electronic system to allow removal and insertion of a field replaceable unit of the modular electronic system.

In yet another embodiment, an apparatus generally comprises a line card receivable in a modular electronic system, arms extending from a front panel of the line card, and a cable support bracket configured for connection to the arms. The cable support bracket is configured for connection to the arms in at least two different positions, each of the positions spacing the cable support bracket a different distance from the front panel of the line card.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, servers, or other electronic devices may be configured as a modular electronic system with a plurality of removable modules (e.g., service cards, line cards, optical modules, fabric cards, power supply units (PSUs), fans (fan trays), filters, or other cards, components, or modules). Many of the modules include ports connected to data or power cables that are routed in such a way that can interfere with access to other modules.

In a modular electronic system, Online Insertion and Removal (OIR) describes a process of replacing a module for repair or replacement (e.g., product upgrade, failed module replacement) while the network device is operational, without disrupting performance of the modular system. During this process, the system continues to be functional and a faulty module is replaced with a new or repaired module. Since remaining modules are still operational, module OIR needs to take place without disconnecting or interfering with cables connected to the remaining modules. Modularity thus creates many limitations on cable management.

Moreover, it is desired and often required to maintain cable bend radius and in some cases, mixing of optical and electrical cables is not allowed. Many service providers also have very stringent cable management guidelines for directional exit of the cables. These requirements become more complicated for modular platforms, where cable management is expected to not interfere with accessibility of the modules during installation or servicing.

The embodiments described herein provide cable management for high-density modular platforms. In one or more embodiments, a cable support system comprises cable management brackets positioned to manage cables connected to modules in a modular electronic system and allow for insertion and removal of a module without interfering with cables connected to other modules. In one or more embodiments, the cable management bracket comprises a fixed portion and a rotatable portion rotatable with the cables to allow for insertion and removal of the modules. The cable management bracket may be connected to a rack supporting the modular electronic system, for example, and positioned above or below the modular electronic system for movement of the rotatable portion without disconnecting the cables. The cable management bracket may also be connected to a module with a rotatable portion extending from one end of the fixed portion to allow for removal and insertion of an adjacent module (field replaceable unit). As described in detail below, the cable support system may comprise many adjustable features to properly align the cable bracket with an exit position of the cable on the module. The cable brackets of the cable support system may be independently configured to manage cables and access the modules during OIR, without disturbing cable routing from other modules. In one or more embodiments, dimensions and positions of the cable management bracket may be optimized for any configuration system to provide independent access to all modules.

Referring now to the drawings, and first to FIG. 1, an example of a network device (modular electronic system) 10 that may implement the embodiments described herein is shown. The modular electronic system 10 may operate, for example, as a switch, router, server, or any other network device comprising modules (components, cards, trays, elements, units) included in modular sections. In one or more embodiments, the network device 10 operates in a data communications network including multiple network devices that may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

In one or more embodiments, the modular electronic system 10 is a programmable machine that may be implemented in hardware, software, or any combination thereof. The modular electronic system 10 may include one or more processor, memory, and network interface. Memory may be a volatile memory or non-volatile storage, which stores various applications, operating systems, modules, and data for execution and use by the processor. The network interfaces may comprise any number of interfaces (e.g., line cards, ports) for receiving data or transmitting data to other devices.

As shown in FIG. 1, the modular electronic system 10 comprises a plurality of modules 14, 16 contained within a frame 12. The system 10 may include one or more frames or structures 12 configured to support various components and slidably receive any number of removable modules 14, 16. FIG. 1 shows a front portion of the frame 12 comprising openings for receiving a plurality of modules 14, 16. The example shown in FIG. 1 includes two rows of line cards 14, with two line cards in each row and a controller card 16 installed on one side of the line cards. Configurable guides may be inserted into the opening of the front panel to define any number of slots for receiving different size modules. Any number of power supply units and fans may be inserted at a rear panel (not shown) of the modular electronic system 10.

In another example, the modular electronic system may include one row of optical modules along with management and control interfaces (as described below with respect to FIG. 2B). Another modular electronic system may include, for example, one column of stacked line cards comprising service cards and controller cards with a fan tray located adjacent to one edge of the line cards and an air filter positioned adjacent to the other edge of the line cards (as described below with respect to FIGS. 11A and 11B). It is to be understood that the type, number, and arrangement of components and modules shown and described herein are only examples and the modular electronic system may include any number or type of modules arranged in any format, without departing from the scope of the embodiments.

The term module as used herein refers to any module, component, or field replaceable unit of the modular electronic system, including, for example, line cards, optical modules, controller cards, fabric cards, service cards, combo cards, fan trays, power supply units, filters, and the like. The module may comprise, for example, a line card connected to cables or a field replaceable unit (e.g., filter) adjacent to the line card.

The term cable as used herein refers to any type of cable connected to the modular electronic system, including, for example, cable carrying data (e.g., Ethernet, fiber optics, optical array, fabric), power, cooling, or any combination thereof. The cable may comprise, for example, fiber data cables, copper data cables, copper power cables, hybrid cables (e.g., data and power cables, data, power, and cooling cables), and the like.

The modular electronic system (network device) 10 may be rack mounted in a rack system 18 (e.g., two or four post rack mounting system with slider brackets) configured to support a plurality of network devices. Each rack bracket comprises a plurality of openings 19 for alignment with a support bracket, which may be connected to the frame 12 of the modular electronic system 10. In the example shown in FIG. 1, only one modular electronic system 10 is installed on the rack 18, however, any number of network devices may be installed above or below the modular electronic system.

One or more of the modules 14, 16 shown in FIG. 1 may be removed for repair or replacement while the other components remain operational. The term OIR (Online Insertion and Removal) as used herein refers to removal of a module from the modular electronic system 10 without removing power from the modular electronic system (i.e., one or more remaining modules are operational). One or more of the modules may be removed and a new module (or repaired module) inserted during the OIR process with the remaining modules operational, or while the modular electronic system 10 (or one or more of the remaining modules) is not operating.

Without the cable support system described herein, the cable routing from the line cards 14 may interfere with the insertion and removal of adjacent modules because the cables may obstruct access to the module. For example, cables from the line cards 14 located on the right side of the network device 10 (as viewed in FIG. 1) would block access to the controller card 16 on the right if the cable routing exits to the right or the line cards 14 on the left if the cable routing exits to the left. For module OIR, all of the cable routing would need to be readjusted, which is not desirable in production networks. Another concern is that optical fibers from the line cards 14 would pass over the controller card 16 and mix with the electrical cable. The cable support system described herein allows for access to modules for OIR without the need to remove or readjust cables connected to adjacent modules, while also managing cables to maintain bend radius and preventing mixing of optical and electrical cables.

In one or more embodiments, the cable support system comprises one or more cable management brackets, generally indicated at 15, installed above or below the modular electronic system 10 (FIG. 1). Each cable management bracket 15 comprises a brace (fixed portion) 20 and one or more rotatable cable brackets (rotatable portions) 22 connected to the fixed portion and operable to move (rotate) between an operating position (as shown for the brackets positioned in front of line cards 14 on the left side of the modular electronic system 10 and the lower line card on the right side of the modular electronic system in FIG. 1) and a module removal position (as shown for the bracket associated with the upper module being removed on the right) to move the bracket and cables out of the way to allow for removal of the module.

The fixed portion (brace) 20 may comprise, for example, a metal bar extending horizontally between vertical posts of the rack 18 with openings 21 at each end aligned with the openings 19 on the rack for receiving a fastener (not shown). In the example shown in FIG. 1, each brace 20 is located immediately above or below the modular electronic system 10, with the cable support system occupying space on the rack equivalent to approximately one rack unit (RU) (0.5 on top and 0.5 on bottom). In the example shown in FIG. 1, support blocks (hinge members) 25 connect the rotatable portion 22 to the fixed portion 20.

The cable management bracket 15 shown in FIG. 1 is configured with one of the rotatable cable brackets 22 corresponding to each line card 14. Thus, the cable support system includes two cable management brackets 15 (one below and one above the modular electronic system 10), with each cable management bracket comprising one brace (fixed portion) 20 and two rotatable portions 22 for routing cables from corresponding modules 14. Each rotatable bracket 22 may be independently configured to manage cables and allow access to the modules card 14 during OIR without distributing the cable routing from other line cards 14, 16 or readjusting the cables disconnected from the OIR module. As previously noted, dimensions and positions of the cable management brackets (fixed portion 20 and rotatable portion 22) may be optimized for any modular electronic system design to provide access to all field replaceable modules.

The rotatable portion 22 comprises a cable support member 24 connected to support blocks 25 by arms 26. The support member 24 may be connected to the arms 26 by a fastener (e.g., bolt, screw, thumb screw, pin) 23. In one or more embodiments, the supporting member 24 may rotate about the fastener 23 to provide additional flexibility in alignment of the cable bracket for proper routing of the cables. The support member 24 may include any number of openings 32 for receiving tie downs to secure the cables in place. As described below, the arms 26 are connected to the support blocks 25 with a hinge pin 27 extending through aligned openings in the support blocks and arms 26 to allow rotation about an axis (X in FIG. 1). In one or more embodiments, the rotating portion 22 may be attached to the fixed portion 20 with a spring loaded mechanism and guide pin assembly so that the rotating portion may be locked into position (e.g., operating position or module removal position), as described below with respect to FIG. 4. The locking position may be defined based on the angle or movement needed for an application or deployment of the bracket and there may be more than one locking position (e.g., varying angles of rotation of the rotatable portion 22 relative to the fixed portion 20).

As described below, the cable management bracket 15 may comprise any number of adjustment features to align the bracket with the position of ports 29 on the front panel of the line cards 14. A plurality of clips ("C" clips) 28 may be included on the arms 26 of the cable bracket and positioned based on the cable routing directions and assist with cable routing and maintaining cable bend radius requirements. The clips 28 may be provisioned on both the left and right side of the cable bracket arm 26, or only one side and may be configured as needed during installation.

Figure 2A:
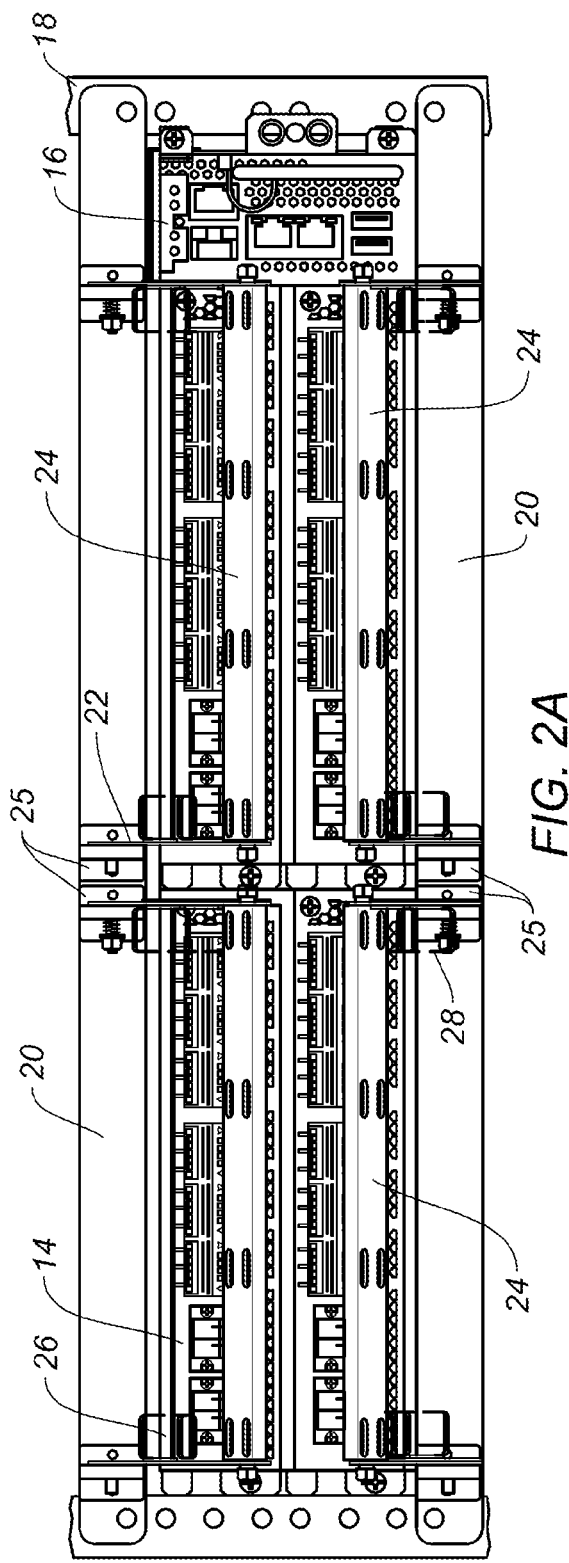
FIG. 2A is front view of the cable support system and modular electronic system shown in FIG. 1.
Figure 2B:
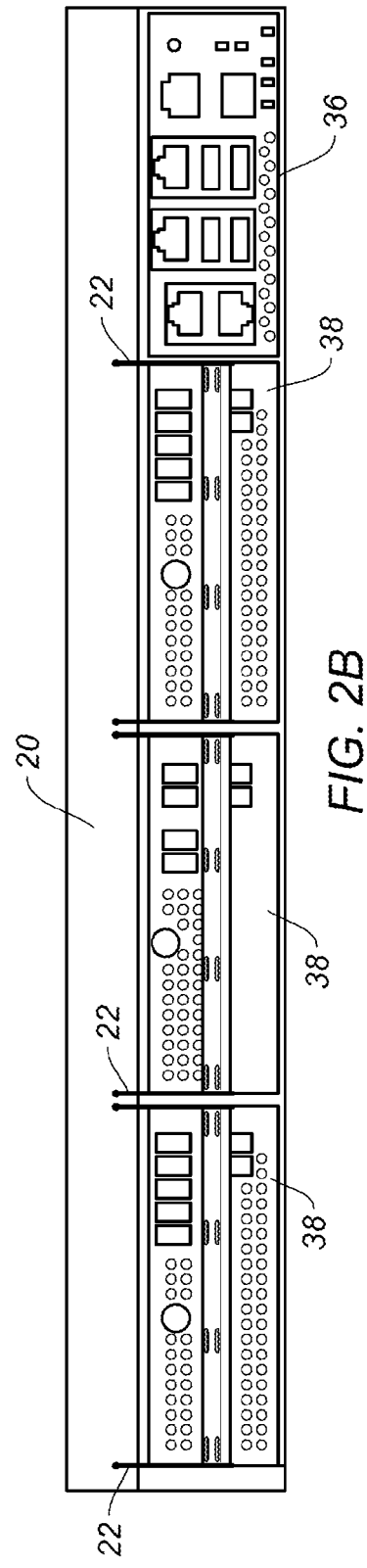
FIG. 2B is front view of the cable support system installed on another modular electronic system.

FIG. 2A is a front view of the modular electronic system 10 and cable support system shown in FIG. 1 with all of the modules 14, 16 installed. As previously noted, the cable support system may be installed on different configuration modular electronic systems. For example, as shown in FIG. 2B, a modular electronic system 36 may include only one row of modules 38. In this example, the fixed portion 20 may be located either above or below the modular electronic system 36 with each rotating portion 22 individually rotatable to allow for insertion and removal of the module 38 without removing or readjusting cables connected to the remaining modules.

Figure 3:
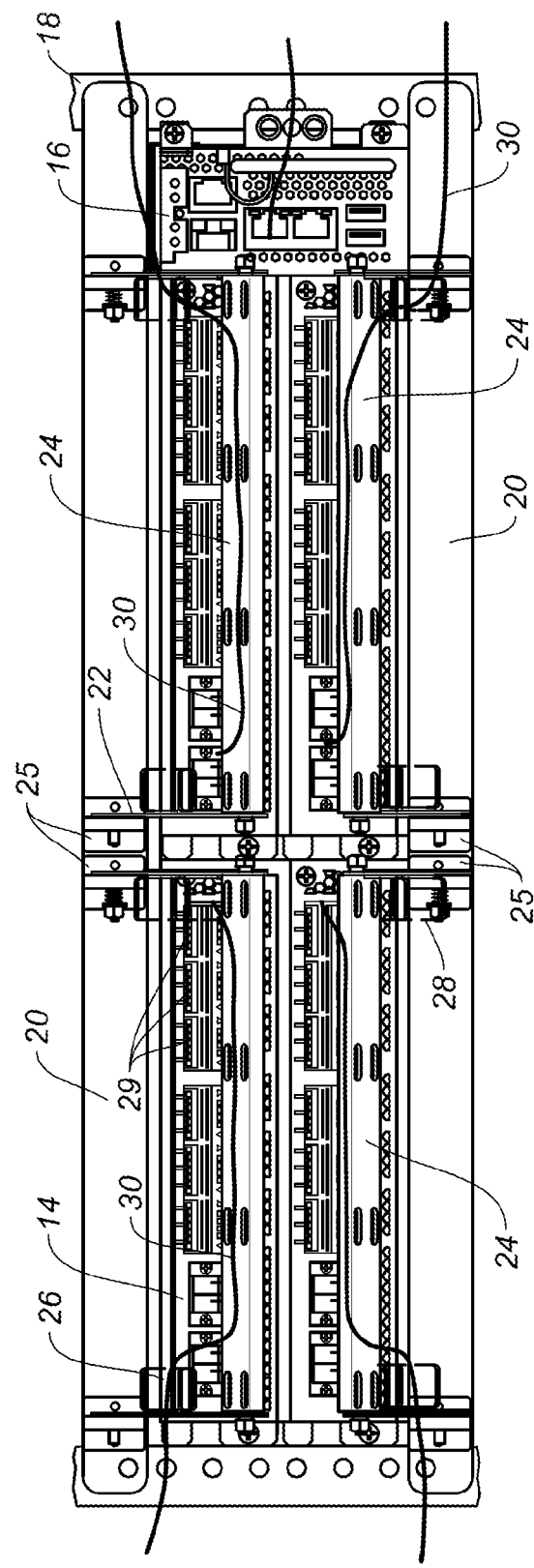
FIG. 3 illustrates cables connected to the modular electronic system and routed on the cable support system shown in FIG. 2A.

FIG. 3 shows cables 30 installed and supported by the cable support system. For simplification, only one cable is shown for each module 14, 16. As shown in FIG. 3, the cables 30 may pass through the clips 28 located on the arms 26 of the cable brackets. In this example, cables 30 from the left line cards 14 exit left and cables from the right line cards 14 exit right. This arrangement may be modified based on deployment preferences. For example, the cables may exit in either direction to avoid mixing of different types of cables.

The cable clips 28 may then be assembled based on the cable exit direction. The cables 30 may be tied down with Velcro straps, wire, tie downs, or any other fastener operable to secure the cable to the support member 24. With this arrangement, the modules 14, 16 have independent cable routing without obstructing any other module. During module OIR, the cables 30 may remain attached to the bracket (rotatable portion) 22 while the bracket is rotated to a default straight orientation, thus providing clear access for module removal or insertion. Once the bracket configuration is adjusted according to the cable exit from the module, no tools are needed to orient the bracket during module OIR and the rotatable portion 22 of the cable management bracket can be easily rotated by hand.

In one or more embodiments, the clips 28 or Velcro straps may be color coded to identify the fiber assignment to respective ports. This helps when the line card is removed with the cables 30 attached to the bracket. The same cables 30 may then be properly connected when a new line card is installed. The fasteners used to attach the cables to the bracket may be multi-loop and multi-colored, for example.

Figure 4:
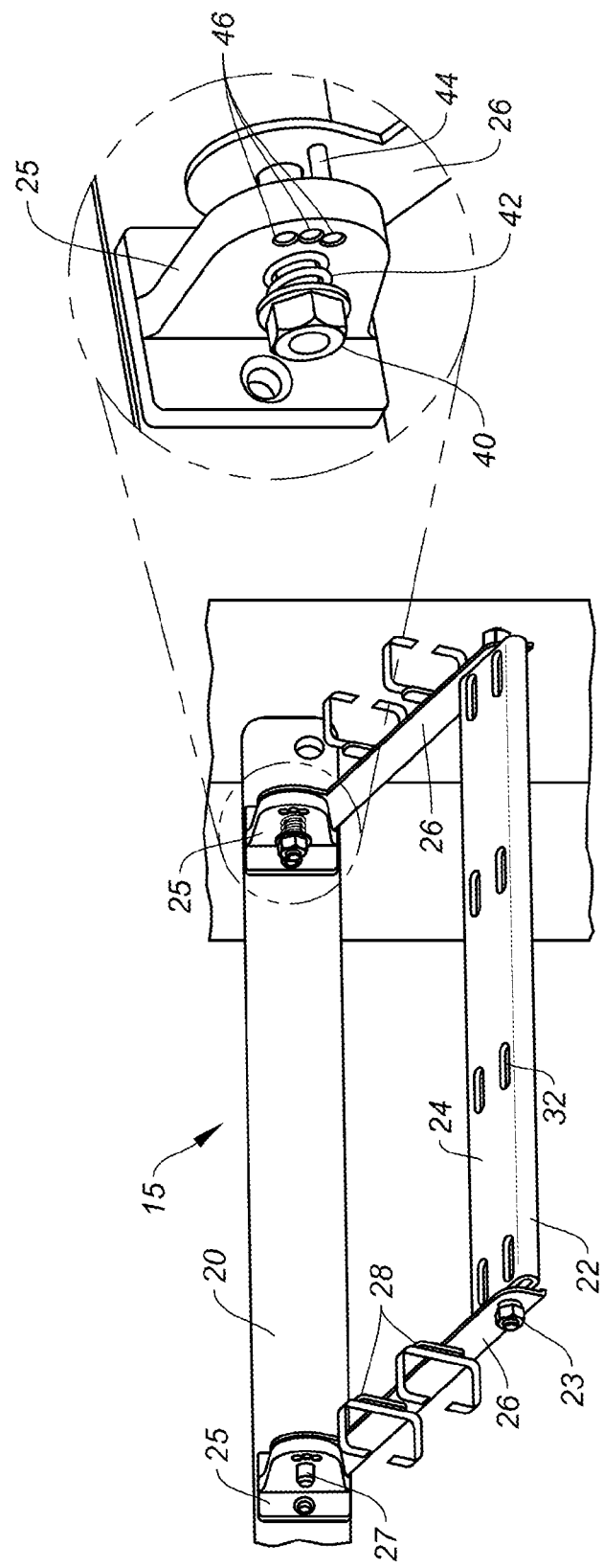
FIG. 4 is a perspective of a cable management bracket of the cable support system shown in FIG. 1.

FIG. 4 illustrates a locking mechanism (shown in detail in exploded view) of the cable management bracket 15, in accordance with one embodiment. As previously described, the locking mechanism may be used to lock the rotatable portion 22 of the bracket in a fixed operating position or in a module removal position in which the rotatable portion and cables supported by the bracket are moved away from the module to allow for removal and insertion of the module. As described further below with respect to FIGS. 6 and 7, additional adjustment may also be provided to align the cables exiting the line cards.

In the example shown in FIG. 4, the locking mechanism comprises a bolt (or other fastener) 40 connecting the support block 25 attached to the brace 20, to the arms 26 of the rotatable portion 22. The bolt 40 and hinge pin 27 (connecting the other arm 26 to the brace 20) provide an axis of rotation for the rotatable portion 22. A spring 42 maintains the bracket in its locked position with guide pin 44 inserted into one of a plurality of openings 46. There may be any number of openings 46 to provide multiple locking positions for use in supporting cable or allowing for module OIR. For example, the different locking positions provided by the guide pin 44 and openings 46 may be used to align the cables with the connected ports on the line cards. As previously noted, the angle of the support member 24 relative to the arms 26 may be adjusted through loosening of thumb screw 23 to align the cable exit from the line card and meet bend radius requirements.

Figure 5A:
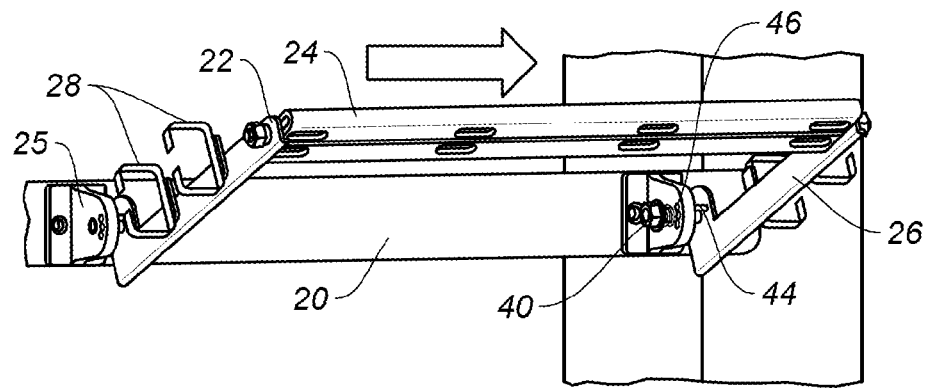
FIGS. 5A-5C illustrate steps for unlocking, rotating, and adjusting the cable management bracket shown in FIG. 4.
Figure 5B:
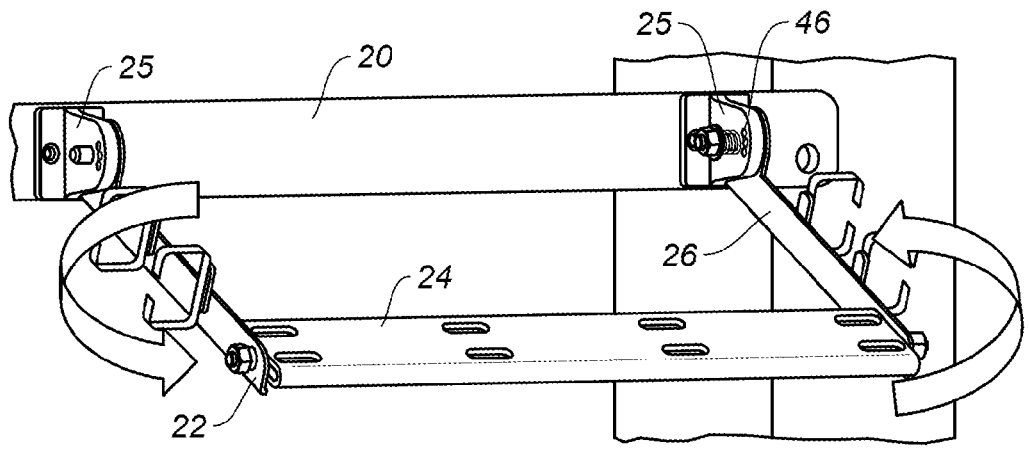
Figure 5C:
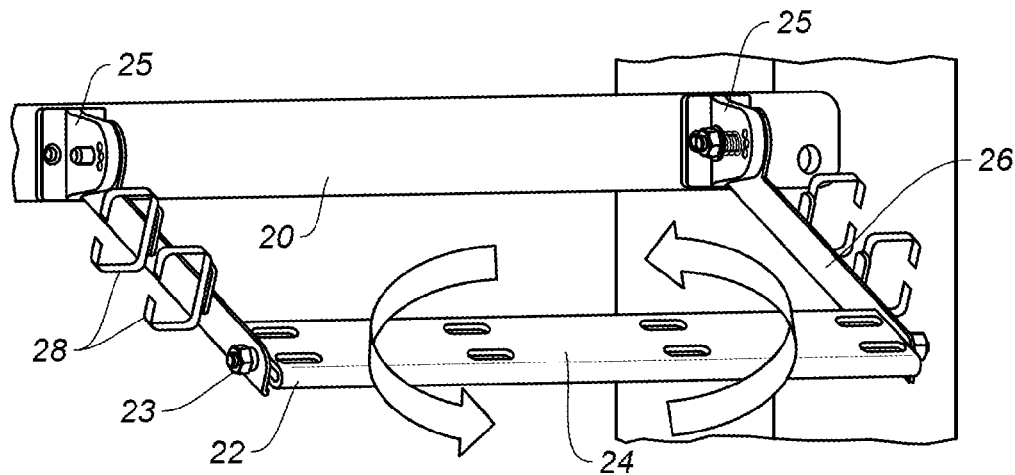

FIGS. 5A-5C illustrate rotational adjustment of the cable management bracket shown in FIG. 4. In order to unlock the bracket, the rotatable portion 22 is slid to the right (as viewed in FIG. 5A) to release the guide pin 44 from opening 46 against the spring force (FIGS. 4 and 5A). The rotatable portion 22 of the bracket may then be rotated up or down based on the line card position (FIG. 5B). When the bracket is released, the guide pin 44 locks in the closest hole 46 (FIGS. 4 and 5B). The angle of the support member 24 may then be adjusted to align with the cable exit position of the ports 29 on the front panel of the line card 14 (FIGS. 1 and 5C).

Figure 6:
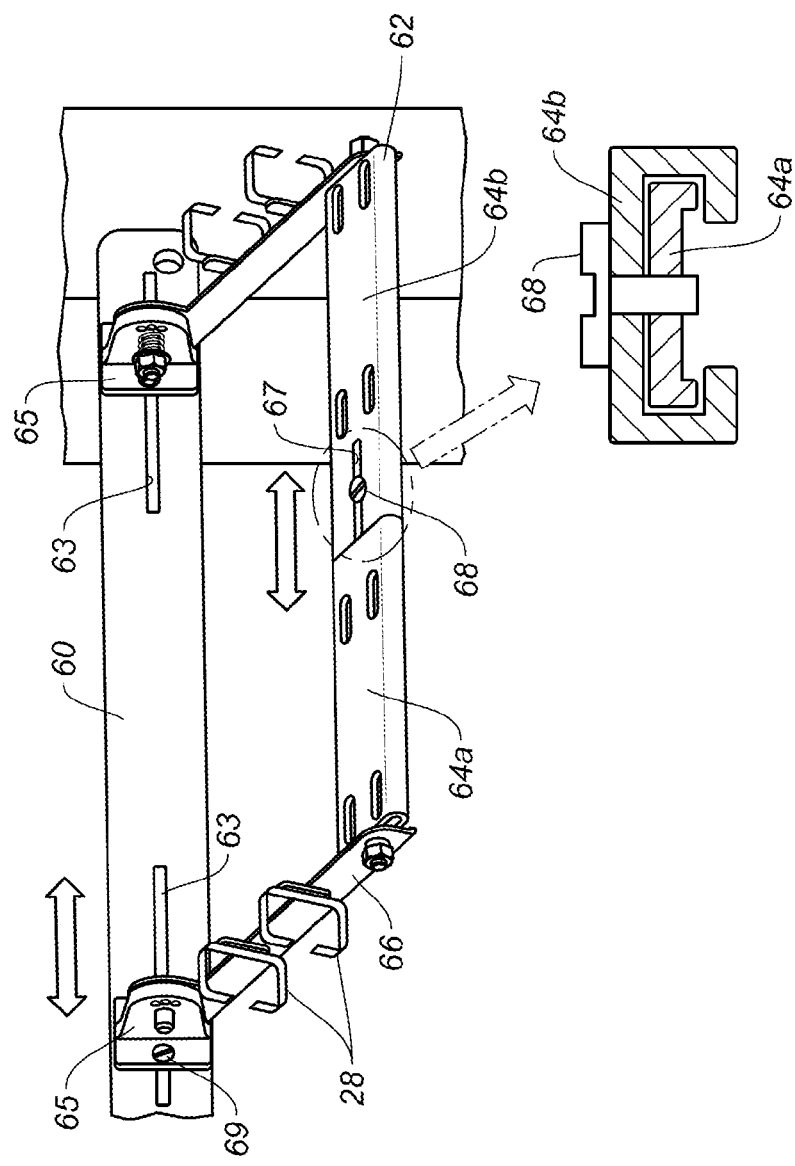
FIG. 6 is a perspective of a cable management bracket with an adjustable width, in accordance with one embodiment.

FIG. 6 illustrates a cable management bracket comprising a fixed portion 60 and a rotatable portion 62 with an adjustable width. Adjustment of the bracket width allows the bracket to fit within any modular electronic arrangement with various size line cards. The fixed portion (brace) 60 includes horizontal slots 63 that allow support blocks 65 connecting arms 66 to the brace to move and thereby change the spacing between connection points. The width of the support member 64a, 64b is also adjustable through slot 67 and fastener 68 so that the width of the support member corresponds to the distance between the support blocks 65. As shown in the exploded view, one side 64a of the support member is slidably receivable in the other side 64b of the support member and the two members are locked in place with the fastener 68. This feature allows the cable management bracket to be adjusted to any dimension based on the width of the module thereby providing flexibility and implementation on different modular electronic systems.

Figure 7:
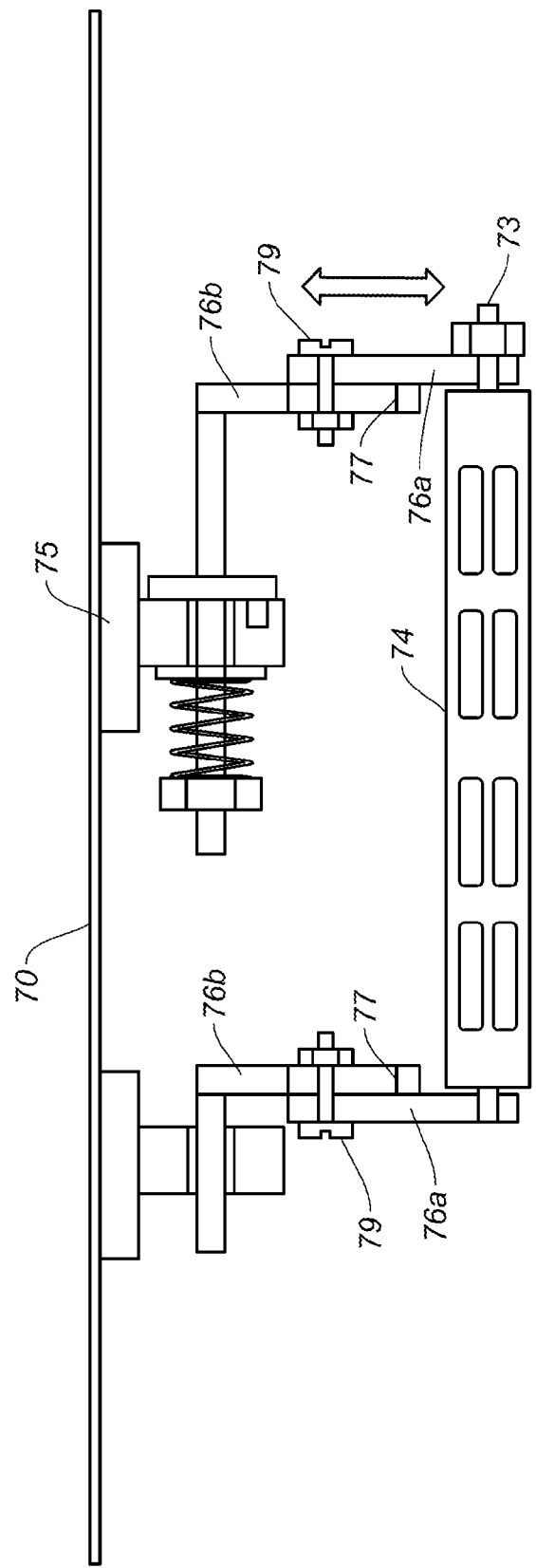
FIG. 7 is a top view of a cable management bracket with an adjustable depth, in accordance with one embodiment.

As shown in FIG. 7, the distance between support member 74 and fixed portion 70 of the cable management bracket may also be adjusted. Extendable arms may accommodate different types of optical transceivers or cable bend radius requirements and allow for different types of deployments, including deployments configured in accordance with one or more standard. In this example, each arm of the bracket comprises two mating members 76a, 76b connected by a fastener 79 (shown in cross-section in FIG. 7). Arm member 76b comprises a slotted opening 77 for receiving the fastener 79 and positioning the arms with a set length. Support block 75 may connect the rotatable portion of the bracket to the fixed portion 70 with locking mechanism 72 and support member 74 may rotate about fastener 73, as previously described.

Figure 8:
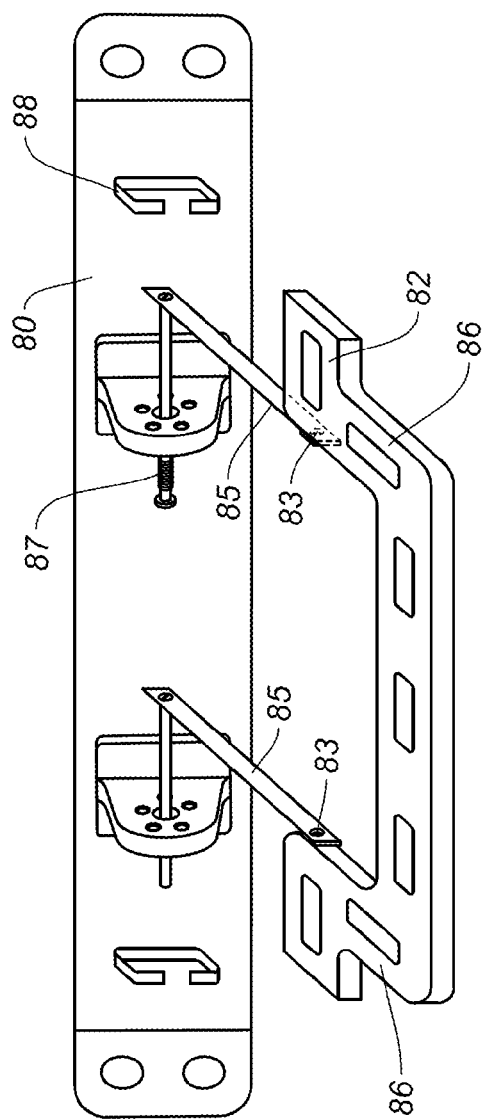
FIG. 8 is a perspective of a cable management bracket with thumb screw adjustment for bracket orientation, in accordance with another embodiment.

FIG. 8 is a schematic illustrating another example of a bracket adjustment mechanism that may be used to properly orient a rotatable portion 82 of the cable management bracket relative to a fixed portion 80. In this example, thumb screws 83 secure arms 86 of the bracket to links 85 in a fixed orientation relative to the fixed portion 80 of the cable support system. Thumb screws 83 may be loosened to provide angular orientation of the rotatable portion 82 of the bracket. The rotatable portion 82 is rotatably connected to the fixed portion 80 through links 85 and locking member 87 may lock the rotatable portion 82 in a fixed position, as previously described.

Figure 9A:
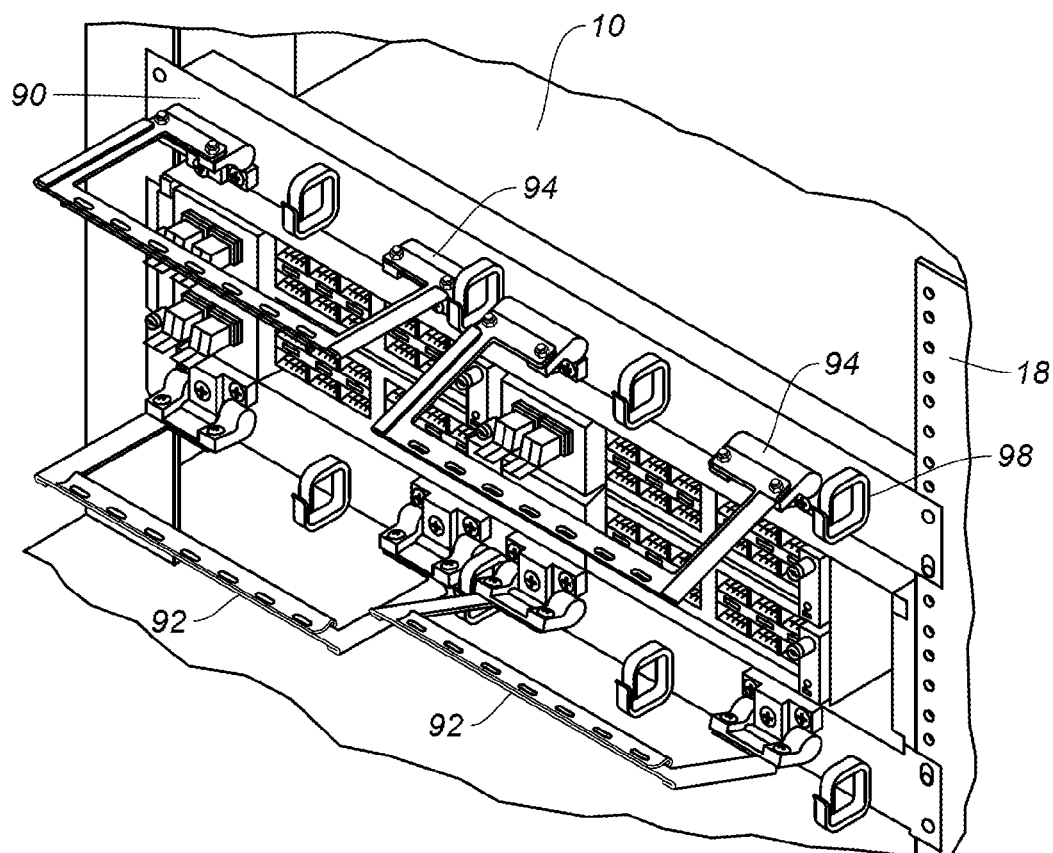
FIG. 9A is a perspective of another embodiment of the cable support system installed on the modular electronic system.
Figure 9B:
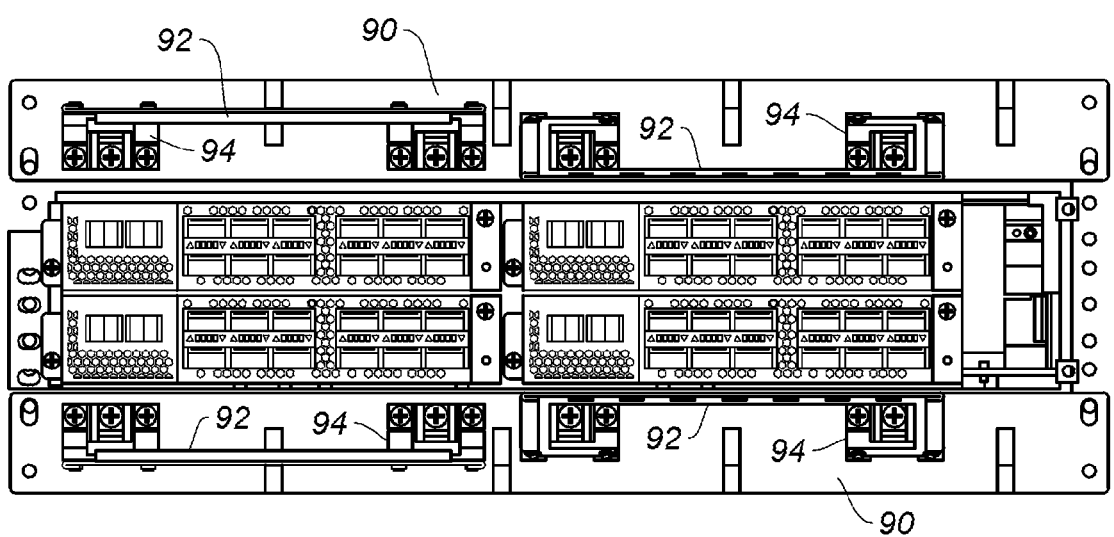
FIG. 9B is a front view of the cable support system and modular electronic system shown in FIG. 9A.

FIGS. 9A and 9B illustrate another embodiment of the cable supporting system. In this example a rotating portion 92 of the cable management bracket is attached to hinged members 94, which are connected to brace 90. Each hinge member 94 comprises an internal locking mechanism (e.g., friction fit or indexed locking positions) that allow for rotation of the rotating portion 92 of the bracket. In this example, clips 98 are attached to the fixed portion 90 of the cable support system rather than the rotating cable bracket 92. Although not shown, clips may also be included on the cable bracket 92.

It is to be understood that the cable management bracket (fixed portion, rotating portion, support member, locking mechanism, clips, adjustment features) shown in FIGS. 1, 2A, 2B, 3, 4, 5A, 5B, 5C, 6, 7, 8, 9A, and 9B and described above are only examples and that other configurations, mechanisms, fasteners, or arrangements may be used, without departing from the scope of the embodiments.

Also, the modular electronic systems 10, 36 shown in FIGS. 1-3, 9A, and 9B are only examples and the modular electronic system, rack, or size, number, or arrangement of modules may be different than shown, without departing from the scope of the embodiments. For example, as previously noted, the modular electronic system may contain any number of rows of modules, with each row containing any number of modules, or any size or type of modules, with any number of ports or interfaces. The rack mounted network device may have a height, for example of 1RU (rack unit), 2RU, or any other height. If there is only one row of line cards, only one cable management bracket is needed and may be mounted above or below the network device.

The modular electronic system may comprise for example, a transponder platform (e.g., Cisco NCS 1004 and the like) (FIG. 1), DWDM (dense wavelength-division multiplexing) line system (e.g., Cisco Network Convergence System (NCS) 1001 and the like) (FIG. 2B), or any convergence system, router, switch, server, or other modular electronic system.

Figure 10A:
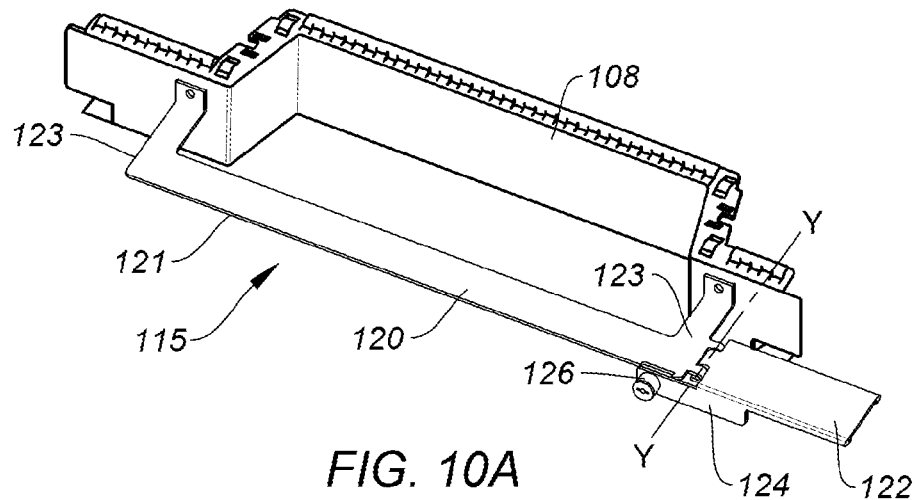
FIG. 10A is a perspective of a cable management bracket in accordance with another embodiment.
Figure 10B:
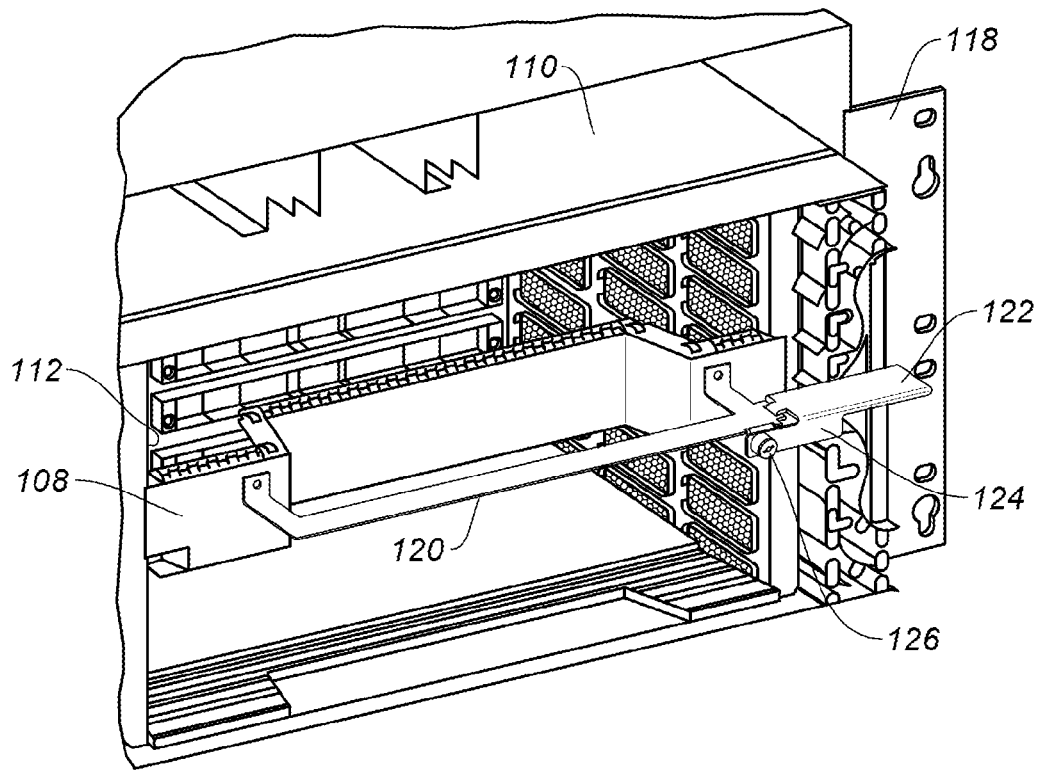
FIG. 10B illustrates the cable management bracket of FIG. 10A attached to a module in a modular electronic system.

FIGS. 10A and 10B illustrate an example of a cable management bracket, generally indicated at 115, installed on a line card in a rack mounted modular electronic system (network device) 110. FIG. 10A is a perspective of a front panel 108 of the line card with the line card management bracket 115 attached. For simplification, cable interfaces and ports are not shown and only the front panel of the line card is shown. The modular electronic system 110 may comprise, for example, a network convergence system such as Cisco NCS 2006, or any other modular electronic system. As shown in FIG. 10B, the modular electronic system 110 comprises a rack mounting bracket 118 and an opening 112 for receiving a plurality of line cards. In operation, all of the slots in opening 112 of the modular electronic system 110 may be filled. The modular electronic system 110 is attached to a rack (not shown) with the rack mounting bracket 118 (one on each side of the modular electronic system 110).

The cable management bracket 115 comprises a fixed portion 120 and a rotatable portion 122. The fixed portion 120 comprises a generally U-shaped member comprising a horizontal portion 121 and two arms 123 extending generally perpendicular therefrom. Each arm 123 is fixedly attached to opposite ends of the line card front panel 108, with the rotatable portion extending from one arm of the fixed portion 120. The rotatable portion 122 is rotatable about an axis (Y in FIG. 10A) extending along a hinged connection to the arm of the fixed portion to which the rotating portion is attached. In one embodiment, the rotating portion 122 is held in place by rotating guide arm 124, which may be locked in place by tightening thumb screw 126, for example. The guide arm 124 is positioned below the rotating cable support member 122, which moves with the guide arm The cable management bracket may also include openings (not shown) for securing the cables thereto or clips for routing the cables, as previously described with respect to FIG. 1.

Figure 11A:
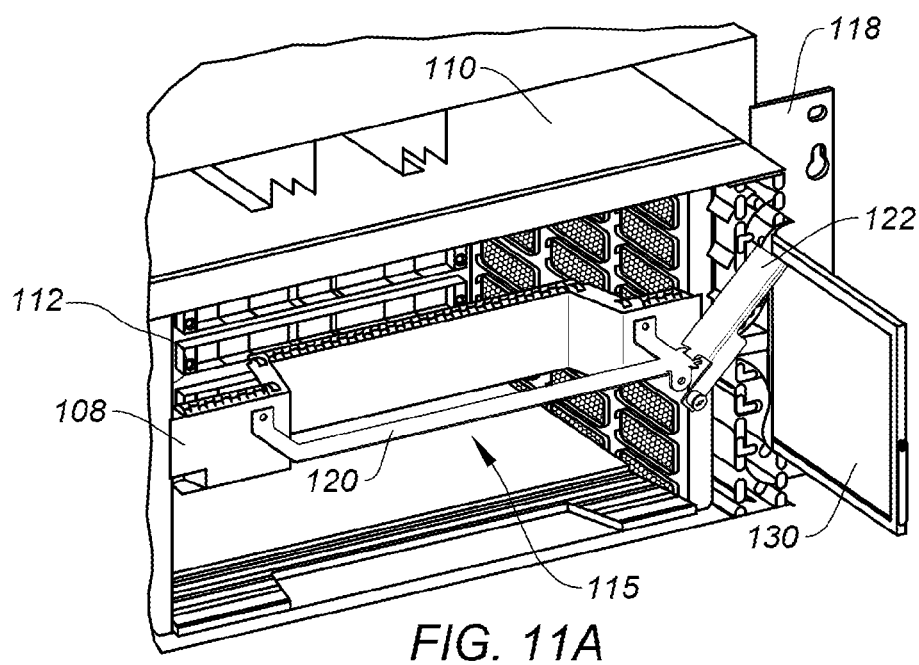
FIGS. 11A and 11B illustrate the cable management bracket of FIG. 10A positioned to allow for filter replacement in the modular electronic system.
Figure 11B:
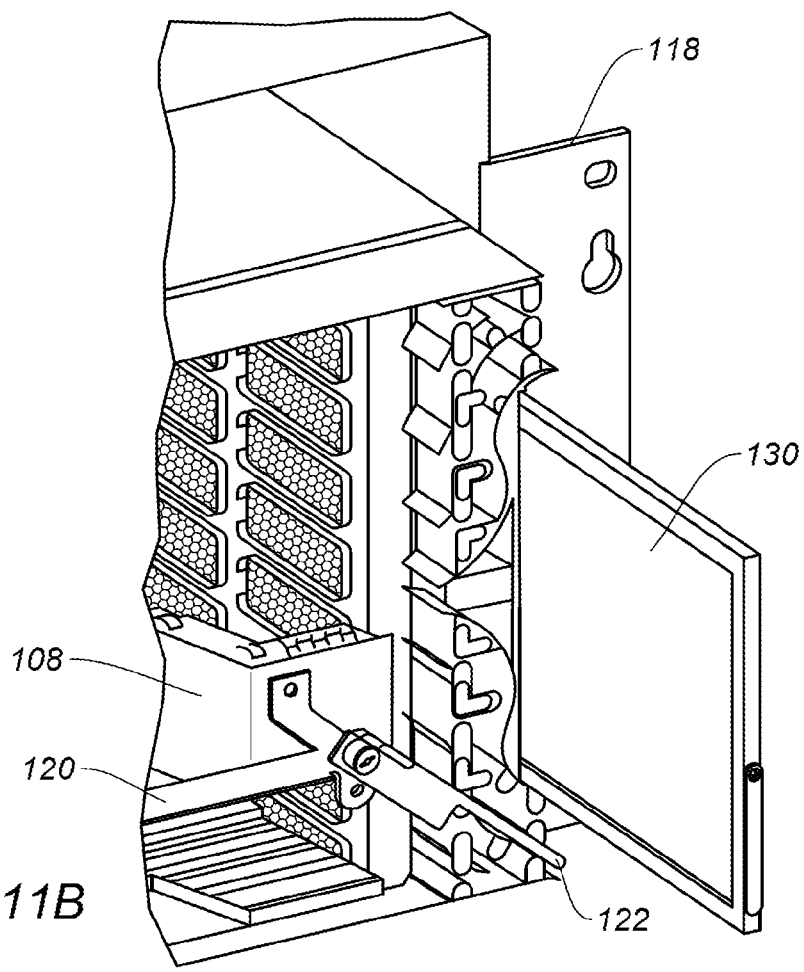

FIGS. 11A and 11B illustrate operation of the cable management bracket 115 during removal of an air filter (field replaceable unit, module) 130 located adjacent to one edge of the line cards. The rotatable portion 122 allows for clear access to the filter 130 so that the cable routing does not obstruct filter access during replacement. A default position of the bracket is shown in FIGS. 10A and 10B. The rotatable portion 122 of the bracket may be rotated up (as shown in FIG. 11A) or down (as shown in FIG. 11B) depending on the location of the line card within the modular electronic system 110. Movement of the rotating portion 122 allows the line card to be installed in any of the slots while still providing clear access to the filter 130 or any other module located adjacent to the line cards (on either side of the line cards). If cables are routed exiting to the left and to the right of the line cards and if access to modules is needed on both sides of the line cards, the bracket may include rotating portions 122 extending from both ends of the fixed portion 120. The cables are moved with the rotating portion 122 of the bracket without the need for removing or readjusting the cables. As previously noted, the modular electronic system 110 may include any number of modules in any arrangement.

One or more of the line cards may be installed in the modular electronic system 110 without the cable management bracket 115. For example, only two (or more) of the line cards may be installed with the cable management bracket 115 and cables from all of the line cards routed over these two brackets, or some of the cables may be routed through other cable guides installed on the modular electronic system 110 or rack. The cable management bracket 115 may be installed only on line cards with a large number of cable connections, for example. In another example, optical fibers may be routed over existing cable guides and thicker Ethernet cables routed on the cable management bracket 115, thereby preventing the mixing of optical fibers with other cables.

Figure 12A:
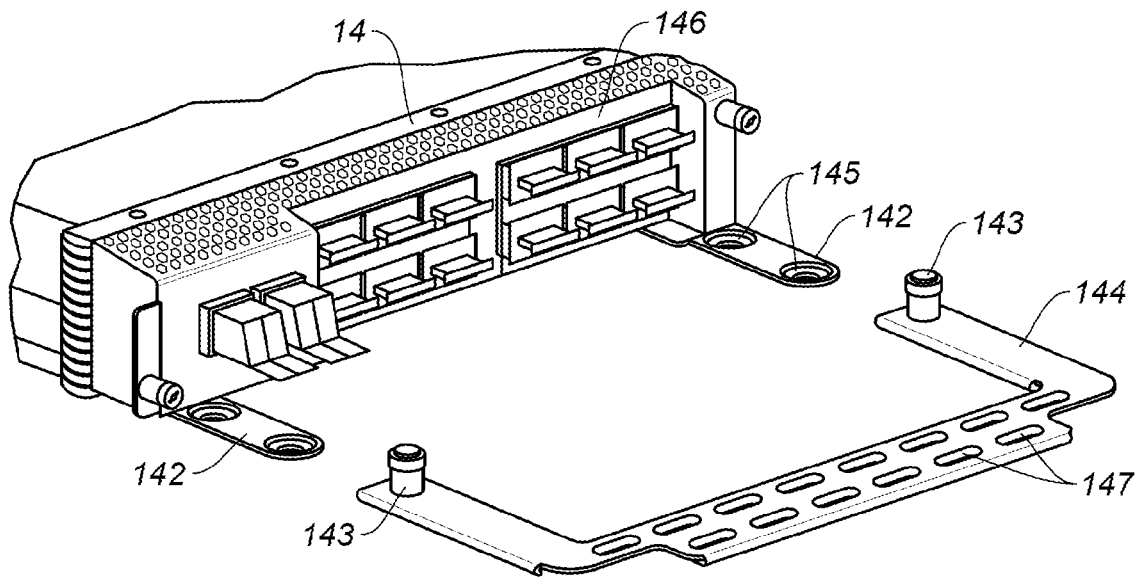
FIG. 12A illustrates a line card and an adjustable line card cable bracket, in accordance with one embodiment.
Figure 12B:
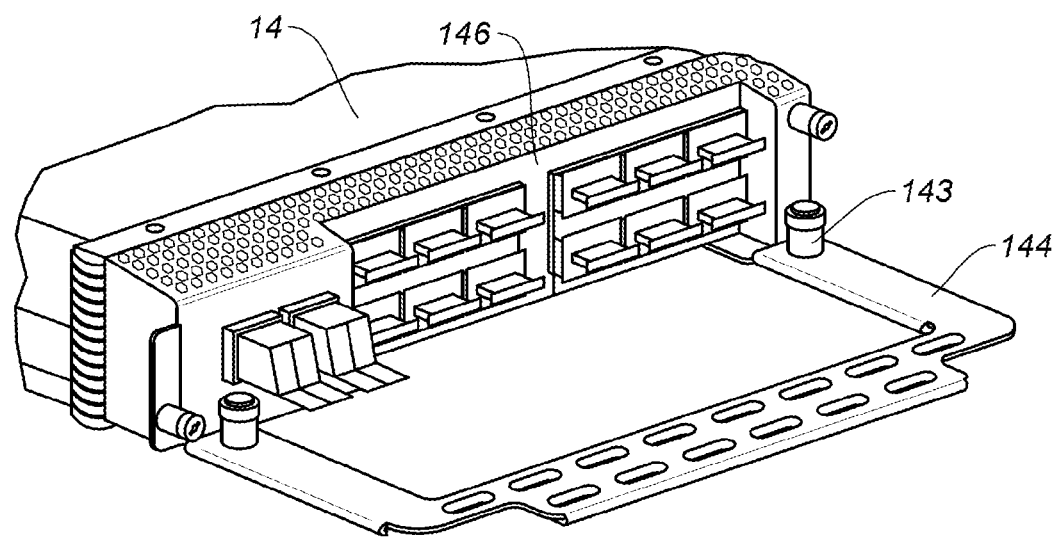
FIG. 12B shows the adjustable line card cable bracket of FIG. 12A connected to the line card.

FIGS. 12A and 12B illustrate an example of a line card cable support bracket 144 that may be attached to the individual line cards 14. The cable support bracket 144 may be used, for example, in place of the cable management bracket 15 in FIG. 1 or one or more of the line cards 14 in FIG. 1 may include the line card cable support bracket shown in FIG. 12A instead of having a corresponding rotatable bracket 22. If all line cards in a row include the line card cable support bracket 144 in place of the cable management bracket 15 shown in FIG. 1, space may be freed up above or below the modular electronic system. If the cable management bracket 15 shown in FIG. 1 is used with the modular electronic system 10, the line card 14 may only include arms 142, which aid insertion and extraction of the line card, without interfering with the cable management bracket 15 (FIGS. 1 and 12A).

In one or more embodiments, the bracket 144 comprises a U-shaped member configured for connection with the arms 142 attached to the line card 14. As shown in FIG. 12A, the arms 142 include at least two openings 145 for receiving a connecting member 143, with the bracket 144 so that the bracket may be spaced from a front panel 146 of the line card with at least two different spacings. In one or more embodiments, spring plungers 143 are used to lock the cable support bracket 144 in place in a position spaced from the front panel 146 of the line card 14 at different distances based on which opening the plunger is inserted to support different fiber bend radius and various deployment conditions. In the example shown in FIGS. 12A and 12B, arms 142 are attached to a lower face of the line card 14 and extend outward therefrom.

The cable support bracket 144 may be formed from a rigid metal such as iron or steel, for example. The bracket 144 is preferably sufficiently thin to be mounted in front of the line card 14 while not obstructing adjacent line cards located above or below the line card and sufficiently thick to support cables. The bracket 144 may be formed from stamping or molding, for example, and may include any number of openings 147 for receiving tie downs to secure cables in place. The bracket 144 may be used as handle for use in removing or inserting the line card 14.

Figure 13A:
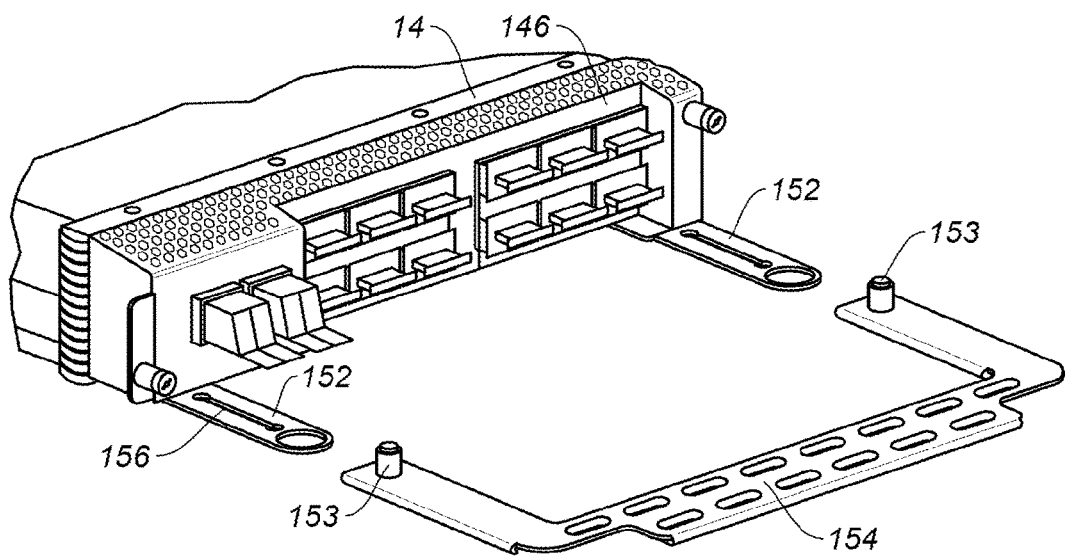
FIGS. 13A and 13B illustrate another embodiment of the adjustable line card cable bracket.
Figure 13B:
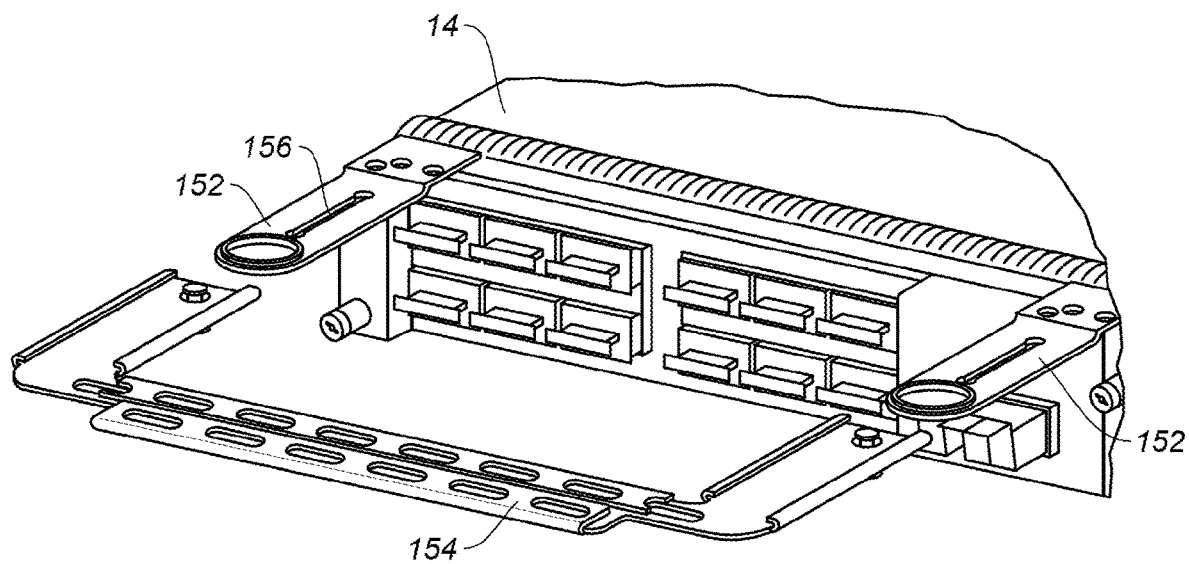

In another embodiment shown in FIGS. 13A and 13B, a cable support bracket (handle) 154 slides over arms 152 attached to the line card. The arms 152 include slots 156 for receiving fasteners 153 with the bracket 154 positioned at varying distances from the front panel 146 of the line card 14. In one embodiment, the fastener 153 is a spring loaded fastener with an exposed button that may be depressed to release the fastener and allow for sliding movement between the bracket 154 and arms 152 extending from the line card 14. After the bracket depth is adjusted, the button is released to allow the spring to force the fastener into its locked position, thereby retaining the bracket in a fixed positioned spaced from the front face 146 of the line card. The fastener 153 combines the attachment feature and keyhole adjustment feature into one spring loaded plunger, as described further below with respect to FIGS. 15A and 15B. The sliding insertion/removal feature eliminates the need for space below or above the line card bracket for removing the bracket in an upward or downward position.

FIG. 14 illustrates a cable support bracket 164 that is pivotably connected to arms 162 and may be swung open to access a highly dense interconnect pluggable on the front panel 146 of the line card 14, for example. In this example, the arms 162 comprise slidably mating members that allow for adjustment of the distance between the bracket 164 and the front panel 146 of the line card 14. The bracket 164 may swing open in either direction by removing thumb screws 168 located on each side of the bracket.

Figure 15A:
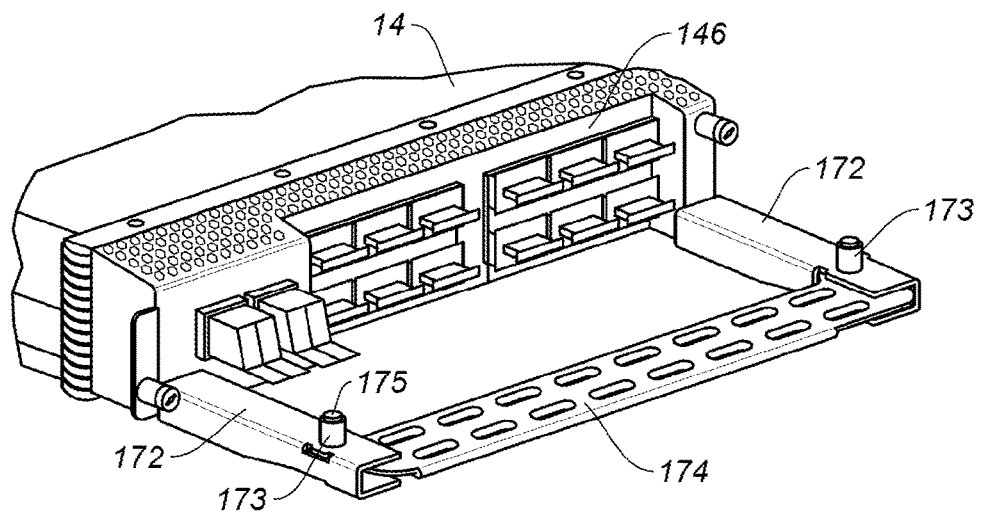
FIG. 15A illustrates yet another embodiment of the adjustable line card cable bracket in a closed position.
Figure 15B:
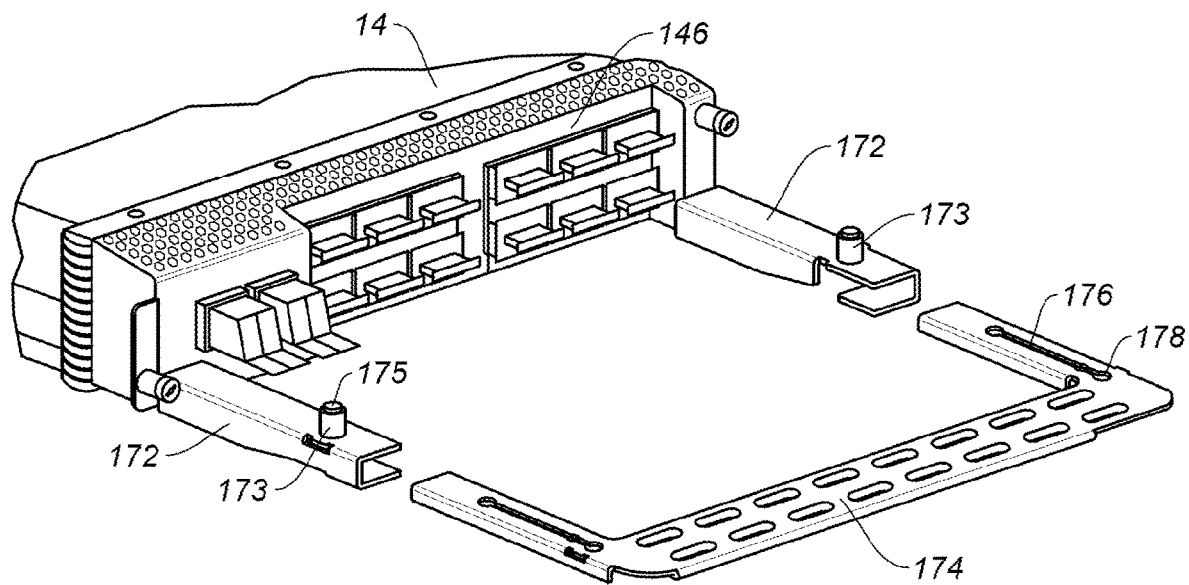
FIG. 15B illustrates the adjustable line card cable bracket of FIG. 15A removed from the line card.

FIGS. 15A and 15B illustrate another embodiment of the adjustable line card bracket. This embodiment is similar to the embodiment shown in FIGS. 13A and 13B except the spring plunger is moved from the bracket to the line card arms. A bracket 174 is slidably receivable in a channel formed in arms 172 connected to the line card 14. A spring loaded plunger 173 is mounted on the arms 172 and extends into the channel. The plunger 173 includes a button 175, which may be depressed to force a shaft of the plunger through opening 178 in the bracket 174. A bottom of the shaft is small enough to fit through opening 178 but larger than adjacent slot 176. The button 175 of the plunger 173 may be depressed to insert or remove the bracket 174 from the line card arms 172 when the bracket is positioned such that the plunger is aligned with openings 178. The bracket 174 may then be moved to its desired position as the shaft of the plunger slides along the slot 176. Once the button 175 is released the bracket 174 is locked in place relative to arms 172. The adjustment feature of the fastener allows for adjustment of the bracket 174 to different depths for different fiber bend requirements and also allows the bracket to be moved to a deeper or extended position, as needed to meet deployment needs. Location of the fasteners 173 at an end portion of the arms 172 allows for easy access to the fastener. The spring loaded, press button fastener 173 provides for both installation/removal of the bracket 174 and adjustment of the bracket depth without tools. In one example, the cables may be disconnected from the line card 14 and the line card replaced without detaching the cables from the system. The bracket (handle) 174 may also be removed to provide better accessibility to the pluggable elements on the front panel 146 of the line card.

It is to be understood that the line card cable support brackets 144, 154, 164, and 174 are only examples and that different types of adjustment means or connectors may be used, without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a module receivable in a modular electronic system;
   a first arm extending from a front panel of the module;
   a second arm extending from the front panel of the module; and
   a cable support bracket comprising a handle, a first bracket arm extending from a first end of the handle and configured to connect to the first arm, and a second bracket arm extending from a second end, opposite the first end, of the handle and configured to connect to the second arm;
   wherein the first bracket arm and the second bracket arm of the cable support bracket are configured to couple to the first arm and the second arm, respectively, at a first distance from the front panel of the module, the first end of the handle is configured to decouple from the first bracket arm, and the second end of the handle is configured to pivot about the second bracket arm to rotate the handle relative to the module and place the first end of the handle at a second distance, different from the first distance, from the front panel of the module.

2. The apparatus of claim 1, further comprising a fastener configured to lock the cable support bracket.

3. The apparatus of claim 2, wherein each of the first arm and the second arm comprises a respective opening, and the fastener is configured to extend through the respective opening of one of the first arm or the second arm to lock the cable support bracket.

4. The apparatus of claim 1, wherein the first bracket arm of the cable support bracket is configured to slide along the first arm, and the second bracket arm of the cable support bracket is configured to slide along the second arm.

5. The apparatus of claim 1, wherein the second end of the handle is configured to pivot about the second bracket arm to rotate the handle toward the module such that the second distance is less than the first distance.

6. The apparatus of claim 1, wherein the cable support bracket is configured to couple to the first arm and the second arm via the first bracket arm and the second bracket arm at a third distance, between the first distance and the second distance, away from the front panel of the module.

7. The apparatus of claim 1, wherein the first bracket arm and the second bracket arm of the cable support bracket extend the handle of the cable support bracket offset from the first arm and the second arm.

8. An apparatus comprising:
   a handle of a cable support bracket, wherein the handle comprises a first opening configured to receive a securement element to mount a cable to the handle;
   a first bracket arm of the cable support bracket, wherein the first bracket arm extends from a first end of the handle and is configured to couple to a first arm of a modular electronic system, and the first bracket arm comprises a second opening at an end of the first bracket arm from the handle; and
   a second bracket arm of the cable support bracket, wherein the second bracket arm extends from a second end, opposite the first end, of the handle and is configured to couple to a second arm of the modular electronic system,
   wherein the first bracket arm and the second bracket arm are configured to couple to the first arm and to the second arm, respectively, at a first distance from a module of the modular electronic system, the first bracket arm and the second bracket arm are configured to couple to the first arm and to the second arm, respectively, at a second distance, different from the first distance, from the module of the modular electronic system, and the second opening of the first bracket arm is configured to receive a fastener to lock the first bracket arm at the first distance from the module or at the second distance from the module.

9. The apparatus of claim 8, wherein the handle, the first bracket arm, and the second bracket arm cooperatively form a U-shape.

10. The apparatus of claim 8, wherein the first bracket arm and the second bracket arm extend planar to the handle.

11. The apparatus of claim 8, wherein the handle is configured to decouple from the first bracket arm of the cable support bracket while remaining coupled to the second bracket arm of the cable support bracket.

12. The apparatus of claim 11, wherein the handle is configured to pivot about the second bracket arm while decoupled from the first bracket arm to rotate the handle relative to the modular electronic system.

13. The apparatus of claim 11, comprising a fastener configured to couple the handle to the first bracket arm, wherein the fastener is removable to decouple the handle from the first bracket arm.

14. The apparatus of claim 13, wherein the fastener comprises a thumb screw.

15. An apparatus comprising:
a module receivable in a modular electronic system;
arms extending from a front panel of the module;
a cable support bracket configured to couple to the arms and move relative to the arms between a first position at a first distance from the front panel of the module and a second position at a second distance, different from the first distance, from the front panel of the module; and a fastener configured to extend through the cable support bracket and one of the arms to lock the cable support bracket in the first position or in the second position.

16. The apparatus of claim 15, wherein the fastener comprises a shaft configured to extend through the cable support bracket and one of the arms, and a portion of the shaft is configured to compress the cable support bracket against one of the arms to lock the cable support bracket in the first position or in the second position.

17. The apparatus of claim 16, wherein the fastener comprises a biasing member configured to urge the shaft to compress the cable support bracket and one of the arms against one another.

18. The apparatus of claim 17, wherein the fastener comprises a button configured to actuate to move the shaft to reduce compression of the cable support bracket and one of the arms against one another.

19. The apparatus of claim 15, wherein the cable support bracket comprises:
a handle; and
bracket arms extending from the handle, wherein the bracket arms are configured to couple to the arms in the first position and in the second position.

20. The apparatus of claim 19, wherein the fastener is configured to extend through one of the bracket arms to lock the cable support bracket in the first position or in the second position.

* * * * *